United States Patent

Ishikawa

[11] Patent Number: 5,949,257
[45] Date of Patent: Sep. 7, 1999

[54] DC LEVEL TRANSITION DETECTING CIRCUIT FOR SENSOR DEVICES

[75] Inventor: Nobuhiro Ishikawa, Ibaraki, Japan

[73] Assignee: Mitutoyo Corporation, Kanagawa, Japan

[21] Appl. No.: 08/947,344

[22] Filed: Oct. 8, 1997

[30] Foreign Application Priority Data

Oct. 8, 1996 [JP] Japan ..................... 8-267029

[51] Int. Cl.$^6$ ..................... H03K 5/153; H03K 17/945
[52] U.S. Cl. ..................... 327/72; 327/34; 327/517
[58] Field of Search ..................... 327/517, 72, 34, 327/317, 311, 379

[56] References Cited

U.S. PATENT DOCUMENTS

| | | | |
|---|---|---|---|
| 4,339,727 | 7/1982 | Kage et al. | 327/63 |
| 5,142,554 | 8/1992 | Stribling et al. | 375/227 |
| 5,307,196 | 4/1994 | Kinoshita | 359/189 |
| 5,392,317 | 2/1995 | Cho et al. | 327/72 |
| 5,438,289 | 8/1995 | Kan et al. | 327/97 |

FOREIGN PATENT DOCUMENTS 2293931  4/1996  United Kingdom ......... H04B 10/158

*Primary Examiner*—Toan Tran
*Attorney, Agent, or Firm*—McDermott, Will & Emery

[57] ABSTRACT

The DC sensor signal S, on which a low frequency waviness component S1 and a high frequency noise component S2, is obtained by amplitude detecting for a sinusoidal output signal from a touch signal probe. For generating a touch trigger signal TG at an sbrupt DC level transition of the DC sensor signal S, the signal S is input to a LPF 21 to output a signal (S0+S1), where S0 is a DC offset component, and S1 is a low frequency waviness component. The amplitude transforming circuit 22 multiplies the signal (S0+S1) by a coefficient k to generate a reference signal k(S0+S1). The comparator 23 compares the DC sensor signal S with the reference signal to output the touch trigger signal TG at the abrupt DC transition point of the DC sensor signal S.

7 Claims, 3 Drawing Sheets

DC LEVEL TRANSITION DETECTING CIRCUIT FOR SENSOR DEVICES

BACKGROUND OF THE INVENTION

Field of the Invention

The present invention relates to a sensor device such as a touch sensor, a pressure sensor, an acceleration sensor, or the like. In particular, the present invention relates to a detecting circuit for detecting DC level transition in a DC sensor signal from such as an ultrasonic touch signal probe, on which low frequency waviness components and high frequency noise components are superimposed.

Prior Art

Conventionally, as a measuring apparatus for measuring shape and size of an object, a height gage, a three-dimensional measuring device, a contour measuring device, and the like are used. In contact-type measuring devices, many kind of touch signal probes are used. In these touch signal probes, there is an ultrasonic touch signal probe. This type of touch signal probe has a piezoelectric device driving a stylus. The touch detection is performed by monitoring amplitude or frequency change of the output signal of the piezoelectric device.

In such a touch sensor with a piezoelectric device, the piezoelectric device is controlled by a positive feedback to be in a resonant state, whereby the detecting electrode of the piezoelectric device outputs a sinusoidal signal. The sinusoidal signal exhibits amplitude and frequency varying in response to the probe contacting with an object to be measured. For example, for touch detecting, a DC sensor signal having only amplitude information may be extracted from the detected sinusoidal signal. The DC sensor signal exhibits abrupt DC level varying in response to the probe contact. Therefore, by detecting the abrupt DC level varying point, a touch trigger signal can be generated. In detail, as shown in FIG. 5, the touch trigger signal TG is generated by comparing the DC sensor signal S with a predetermined reference potential $V_{RF}$.

However, the above-mentioned DC level transition detecting method has such a problem as to tend to generate a detecting error. As shown in FIG. 5, the sensor signal S has a DC offset component on which low frequency waviness components (i.e., low frequency state varying component, or slow amplitude change), and high frequency noise components are superimposed. Therefore, when the reference potential $V_{RF}$ is not suitable, in addition to the touch trigger signal TG generated at the DC level varying point of the sensor signal S, error signals are generated due to the low frequency waviness components and high frequency noise components, as shown in FIG. 5. Even if the high frequency noise component has a small and about constant amplitude, when the reference potential $V_{RF}$ is set to be too high for reference, the low frequency waviness component causes the error detection. By contrast, if the reference potential $V_{RF}$ is set to be too lower for the purpose of preventing the error detecting, the rising point of the touch trigger signal TG is largely shifted from the to-be-detected transition point. This also leads to a detecting error.

These problems are existent in, not only touch sensor but also pressure sensor, acceleration sensor and the like in which it is necessary to process similar DC sensor signals.

SUMMARY OF THE INVENTION

The present invention provides a DC level transition detecting circuit for sensor devices, which is able to accurately detect abrupt DC level transition in a DC sensor signal.

According to the present invention, a DC level transition detecting circuit for detecting abrupt DC level transition in a DC sensor signal on which a waviness component and a noise component whose frequency is higher than the waviness component are superimposed, the abrupt DC level transition being generated in response to a to-be-detected physical change, comprising: a low-pass filter for inputting the DC sensor signal to remove the noise component and the abrupt DC level transition component in the DC sensor signal, thereby outputting an intermediate output signal including the waviness component; amplitude transforming means for inputting the intermediate output signal to transfor the amplitude of the intermediate output signal at a predetermined rate, thereby outputting a reference signal; and comparing means for comparing the DC sensor signal with the reference signal output from the amplitude transforming means to extract the DC level transition component.

In the preferred embodying mode, the DC sensor signal is an output of an amplitude detector for detecting an amplitude information in a sinusiodal signal output from an ultrasonic touch signal probe.

In the present invention, by inputting the DC sensor signal to a low-pass filter, high frequency noise components and the abrupt DC level transition component which also includes a high frequency component are removed, and an intermediate output signal including low frequency waviness components can be obtained. The intermediate output signal is converted to a reference signal by amplitude modulating at a predetermined rate. By comparing the DC sensor signal with the reference signal, the abrupt DC level transition can be surely detected.

Instead of the conventional reference signal having a constant level, in the present invention, the reference signal is made to include the low frequency waviness components in the DC sensor signal. Therefore, the influence of both the high frequency noise components and the low frequency waviness components can be removed, thereby resulting that the DC level transition point can be accurately detected.

BRIEF DESCRIPTION OF THE DRAWINGS

The preferred embodiment of the present invention will be described in detail, with reference to the following drawings.

DETAILED DESCRIPTION OF THE PREFERRED EMBODIMENT

Figure 1:
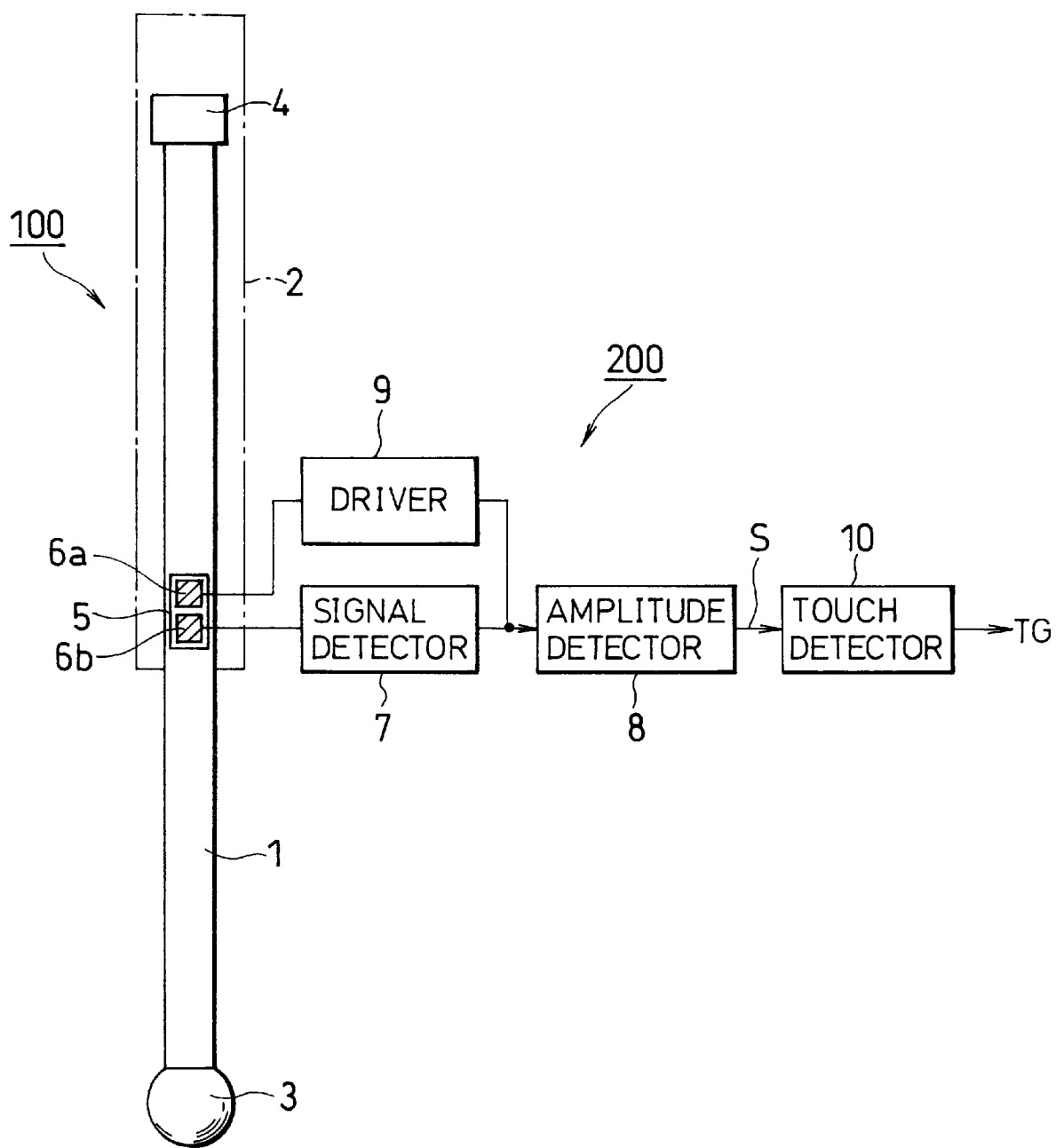
FIG. 1 shows a touch sensor device according to the embodiment of the present invention.

As shown in FIG. 1, the touch sensor device has an ultrasonic touch signal probe 100 and a signal processing circuit 200 for processing the output signal of the probe 100. The probe 100 has a stylus 1 on whose front and back ends a ball 3 and a balancer 4 are attached, respectively. The stylus 1 is held by a stylus holder 2 at about central portion.

At about central portion of the stylus 1, a piezoelectric device 5 is installed for vibrating the stylus 1. A driver 9 supplies a drive signal to a driving electrode 6a of the piezoelectric device 5, whereby an electromechanical-transduced signal can be output on a detecting electrode 6b. The electromechanical-transduced output signal of the piezoelectric device 5 is detected by a signal detector 7. The output of the signal detector 7 is feed-forwarded to the driver 9. By this feed-forward control, the piezoelectric device 5 is driven in a resonant state at a predetermined resonant frequency.

The output of the signal detector 7 is a sinusiodal signal, the amplitude of which is changed when the ball 3 is contacted with an object to be measured. The sinusoidal output signal of the signal detector 7 is input to an amplitude detector 8, whereby a DC sensor signal S is output from the amplitude detector 8. The DC sensor signal S has a DC offset component on which low frequency waviness components and high frequency noise components are superimposed. The DC sensor signal also exhibits abrupt DC level varying when the ball 3 is brought into contact with the object to be measured. The amplitude detector 8 comprises, for example, a full-wave rectifier and an LPF. The DC sensor signal S is input to a touch detector 10. The touch detector 10 detects an abrupt DC level transition in the DC sensor signal S to output a touch trigger signal TG.

Figure 2:
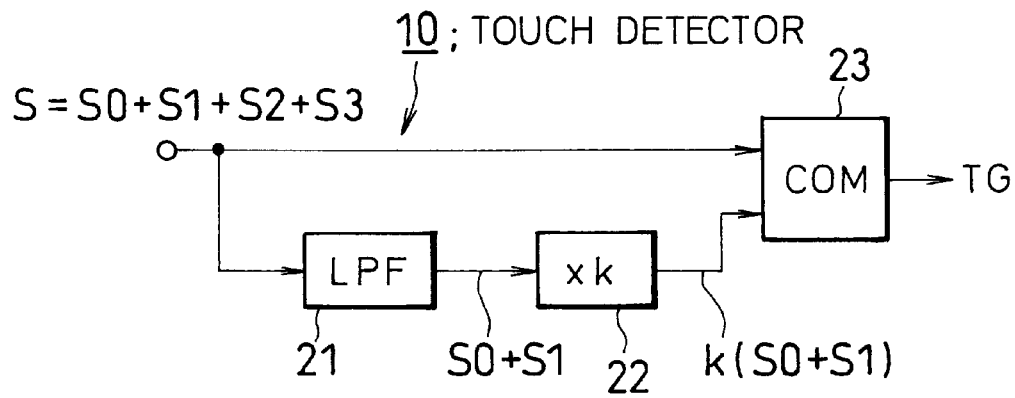
FIG. 2 shows the touch detector in the touch sensor device.

As shown in FIG. 2, the touch detector 10 comprises an LPF 21 for inputting the DC sensor signal S, an amplitude transforming circuit 22 for multiply the amplitude of an intermediate output signal from the LPF 21 by a predetermined coefficient k, and a comparator 23 for comparing the DC sensor signal S with a reference signal output from the amplitude transforming circuit 22.

The LPF 21 has such a cut-off frequency as to remove the high frequency noise component S2 and the abrupt DC level transition component S3 in the DC sensor signal S, and transmit the DC offset component S0 and the low frequency waviness component S1. Therefore, the intermediate output signal output from the LPF 21 includes only the DC offset component S0 and the waviness component S1.

The amplitude transforming circuit 22 is, for example, an analog multiplier. The intermediate output signal (S0+S1) is multiplied by the coefficient k in the amplitude transforming circuit 22 to be the reference signal k(S0+S1). The DC sensor signal S and the reference signal k(S0+S1) are input to the signal input terminal and the reference input terminal of the comparator 23, respectively. When the DC sensor signal S is decreased to cross the reference signal k(S0+S1), the comparator 23 is inverted to output the touch trigger signal TG.

Figure 3:
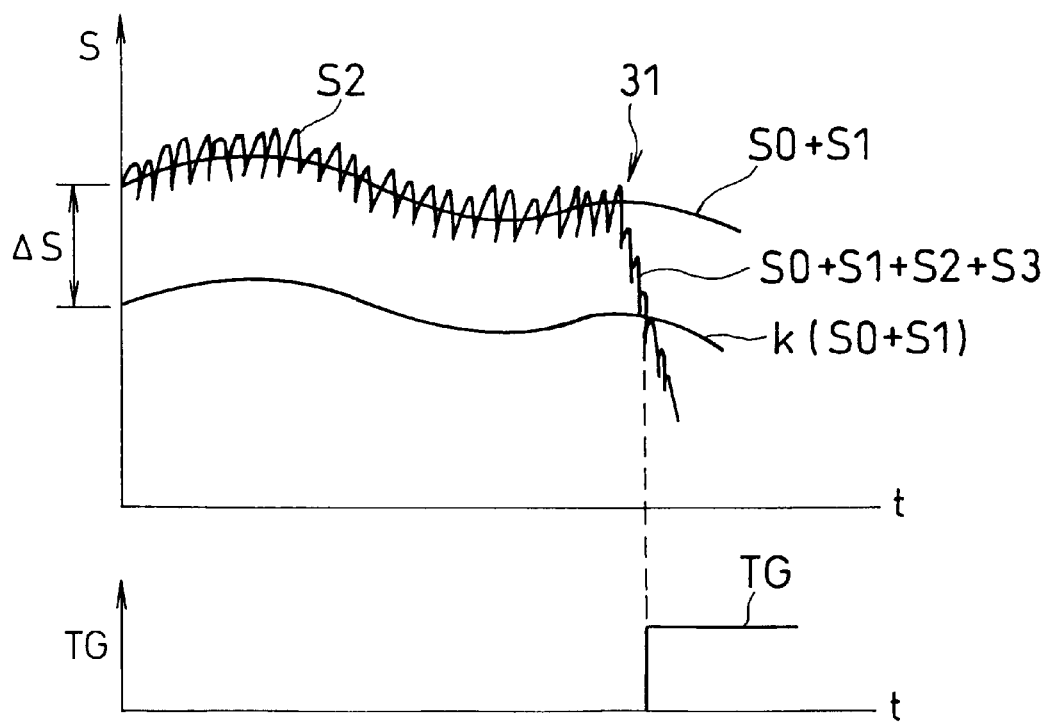
FIG. 3 shows the operation of the touch detector.

In detail, the operation of the touch detector 10 will be described with reference to FIG. 3. As shown in FIG. 3, the DC sensor signal S has the DC offset component S0 on which the low frequency waviness component S1 and the high frequency noise component S2 are superimposed, and includes the DC level transition component S3 generated at an sbrupt amplitude varying point 31 which is to be detected, as the following equation (1). The waviness component S1 is generated due to temperature change, aging and the like.

$$S = S0 + S1 + S2 + S3 \quad (1)$$

By inputting the DC sensor signal S to the LPF 21, the high frequency noise component S2 and the abrupt DC level transition component S3 are removed, and the intermediate output signal (S0+S1) is obtained. The intermediate output signal (S0+S1) is multiplied by the coefficient k (where, k<1) in the amplitude converting circuit 22. As a result, as shown in FIG. 3, the intermediate output signal (S0+S1) is decreased by Δ S to be the reference signal k(S0+S1). The reference signal k(S0+S1) is input to the comparator 23 as a reference for inverting detection. At the abrupt DC level varying point 31, the touch trigger signal TG rises to high level.

It should be appreciated that accurate touch detecting can be performed by setting the coefficient k (i.e., by setting Δ S in FIG. 3) to be a suitable value, as described bellow.

The difference Δ S between the output signal (S0+S1) and the reference signal k(S0+S1) is as follows.

$$\Delta S = (1-k)(S0+S1) \quad (2)$$

Assuming that the coefficient k is a positive value smaller than 1, it is necessary for preventing error detection that Δ S is always larger than the amplitude of the high frequency noise S2. Therefore, the following condition (3) is obtained.

$$\Delta S = (1-k)(S0+S1) > |S2| \quad (3)$$

By solving the equation (3) for the coefficient k, the following inequality (4) is obtained.

$$k < 1 - \frac{|S2|}{(S0+S1)} \quad (4)$$

In this embodiment, the DC offset component S0 is positive and constant. Assuming that the low frequency waviness component S1 is changed between the positive maximum |S1| and the negative maximum—|S1| around the DC offset component S0, it is necessary for always satisfying the condition (3) that the coefficient k is selected in the following inequality (5).

$$k < 1 - \frac{|S2|}{(S0-|S1|)} \quad (5)$$

The inequalities (4) and (5) are necessary conditions for generating the touch trigger signal without noise influences. However, if the coefficient k is set to be too small, the touch trigger signal TG may be generated away from the DC level varying point 31. Therefore, in practice, it is preferred to select the coefficient k as close 1 as possible in the condition (4) or (5), thereby setting Δ S to be small.

Figure 5:
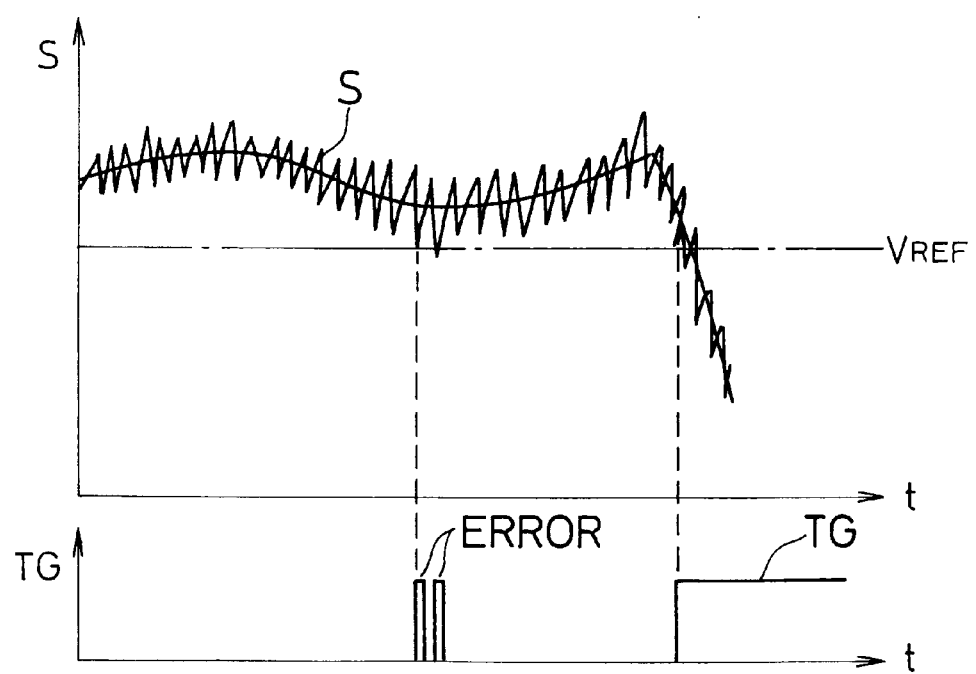
FIG. 5 shows the operation of touch trigger signal generation in a conventional device.

In the conventional method shown in FIG. 5, to prevent the touch detector from error detection, it is necessary to set the reference potential $V_{RF}$ in consideration of both the high frequency noise component and the low frequency waviness component. By contrast, as shown in FIG. 3, in this embodiment, the reference signal is generated so as to include the low frequency waviness component. Therefore, since it is not necessary to consider the influence of the waviness component, Δ S can be set to be small.

For setting the coefficient k in a practical device, a certain coefficient k is preset. In this condition, if a touch trigger signal is generated in spite of that the probe is not contacted with an object, it should be recognized that the preset coefficient k is too small. Based on such a consideration, the coefficient k can be set as close 1 as possible without error detection.

As apparent from the formula (3), Δ S is not constant, but influenced by the slow varying component S1. However, assuming that S1 is sufficiently smaller than S2, the following approximation (6) is concluded. That is, Δ S is recognized to be approximately constant under the above condition.

$$\Delta S = (1-k)(S0+S1) \approx (1-k) S0 \quad (6)$$

Therefore, in this case, the coefficient k can be selected as close 1 as possible in the following inequality (7).

$$k < 1 - \frac{|S2|}{S0} \quad (7)$$

As described above, in the embodiment, a high frequency noise component is removed from the DC sensor signal to output a reference signal including a low frequency waviness component, and then the DC sensor signal is compared with the reference signal. Therefore, without influences of high frequency noise component and low frequency waviness component, the DC level transition in the DC sensor signal in response to the probe touching can be accurately detected.

Although the above-described embodiment is applied to a touch sensor with an ultrasonic touch trigger probe in such a manner that the touch sensing is performed based on the DC sensor signal including an amplitude information, the present invention is not limited to the embodiment. It should be appreciated that other DC sensor signals, for example including frequency information or phase information extracted from the probe output, can be used for touch detecting. Furthermore, the present invention can be applied for DC signal processing of a pressure sensor, an acceleration sensor, and the like.

Figure 4:
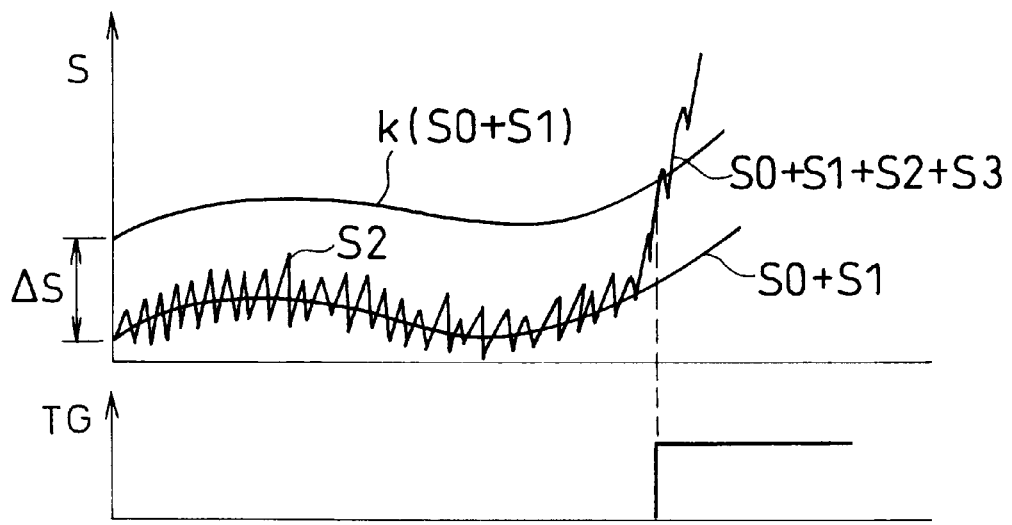
FIG. 4 shows the operation of touch trigger signal generation according to another embodiment.

FIG. 4 shows another case that a DC sensor signal S is abruptly increased at a to-be-detected timing. In this case, the circuit in FIG. 2 can also be used by suitably setting the coefficient k to be larger than 1. As similar to the above-described embodiment, the DC level transition component can be detected in such a manner that the DC sensor signal is compared with the reference signal k(S0+S1).

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

The entire disclosure of Japanese Patent Application No.8-267029 filed on Oct. 8, 1996 including specification, claims, drawings and abstract are incorporated herein by reference in its entirety.

What is claimed is:

1. A detecting circuit for detecting abrupt DC level transition in a DC sensor signal on which a waviness component and a noise component whose frequency is higher than the waviness component are superimposed, the abrupt DC level transition being generated in response to a to-be-detected physical change, comprising:

a low-pass filter for inputting the DC sensor signal to remove the noise component and the abrupt DC level transition component in the DC sensor signal, thereby outputting an intermediate output signal including the waviness component;

amplitude transforming means for multiplying the intermediate output signal by a coefficient k to transform the amplitude of the intermediate output signal, thereby outputting a reference signal, the coefficient k being smaller than 1 in such a case that the abrupt DC level transition is in a direction of level decrease, the coefficient k being larger than 1 in such a case that the abrupt DC level transition is in a direction of level increase; and comparing means for comparing the DC sensor signal with the reference signal output from the amplitude transforming means to extract the DC level transition component.

2. The detecting circuit according to claim 1, wherein:

the coefficient k is set to be as close 1 as possible in the following inequality, in such a case that the abrupt DC level transition is in a direction of level decrease:

$$k < 1 - \frac{|S2|}{(S0 + S1)}$$

where, S0: DC component, S1: waviness component, S2: noise component.

3. The detecting circuit according to claim 1, wherein:

the coefficient k is set to be as close as 1 in the following equality, in such a case that the abrupt DC level transition is in a direction of level decrease:

$$k < 1 - \frac{|S2|}{(S0 - |S1|)}$$

wherein, |S1|: positive maximum of the waviness component, −|S1|: negative maximum of the waviness component.

4. The detecting circuit according to claim 2, wherein:

the coefficient k is set to be as close as 1 in the following equality, when DC component S0 is sufficiently larger than the waviness component |S1|:

$$k < 1 - \frac{|S2|}{S0}.$$

5. The detecting circuit according to claim 3, wherein:

the coefficient k is set to be as close as 1 in the following equality, when DC component S0 is sufficiently larger than the waviness component |S1|:

$$k < 1 - \frac{|S2|}{S0}.$$

6. The detecting circuit according to claim 1, wherein:

the DC sensor signal is an output of an amplitude detector for detecting an amplitude information in a sinusoidal signal output from an ultrasonic touch signal probe.

7. A touch sensor device, comprising:

an ultrasonic touch signal probe on which a piezoelectric device is installed so as to be driven in a resonant state, thereby outputting a sinusoidal signal;

an amplitude detector for inputting the sinusoidal signal to detect the amplitude information of the sinusoidal signal, thereby outputting a DC sensor signal on which a waviness component and a noise component whose frequency is higher than the waviness component are superimposed, an abrupt DC level transition component being generated in the DC sensor signal when the touch signal probe is contacted with an object;

a low-pass filter for inputting the DC sensor signal to remove the noise component and the abrupt DC level transition component in the DC sensor signal, thereby outputting an intermediate output signal including the waviness component;

amplitude transforming means for multiplying the intermediate output signal by a coefficient k which is smaller than 1 to transform the amplitude of the intermediate output signal, thereby outputting a reference signal; and comparing means for comparing the DC sensor signal with the reference signal output from the amplitude transforming means to extract the DC level transistor component.

* * * * *